(12) United States Patent
Zhang et al.

(10) Patent No.: US 10,866,671 B2
(45) Date of Patent: Dec. 15, 2020

(54) FLEXIBLE TOUCH SUBSTRATE, METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhenhua Zhang, Beijing (CN); Yingsong Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/406,471

(22) Filed: May 8, 2019

(65) Prior Publication Data
US 2020/0026382 A1    Jan. 23, 2020

(30) Foreign Application Priority Data
Jul. 19, 2018   (CN) .......................... 2018 1 0796790

(51) Int. Cl.
| G06F 3/041 | (2006.01) |
| H05K 1/02 | (2006.01) |
| H05K 1/03 | (2006.01) |
| H05K 1/11 | (2006.01) |
| H05K 3/32 | (2006.01) |

(52) U.S. Cl.
CPC ........... *G06F 3/0412* (2013.01); *H05K 1/028* (2013.01); *H05K 1/0393* (2013.01); *H05K 1/118* (2013.01); *H05K 3/321* (2013.01); *H05K 3/326* (2013.01); *G06F 2203/04102* (2013.01); *G06F 2203/04103* (2013.01)

(58) Field of Classification Search
CPC .... G06F 3/0412; G06F 3/0443; G06F 3/0445; G06F 3/0446; G06F 2203/04102; G06F 2203/04103; G06F 2203/04112; H05K 1/028; H05K 1/0393; H05K 1/118; H05K 3/321; H05K 3/326
See application file for complete search history.

(56) References Cited

U.S. PATENT DOCUMENTS

| 2019/0004642 A1* | 1/2019 | Chen ..................... H01L 51/003 |
| 2019/0171322 A1* | 6/2019 | Zhai ........................ G09F 9/301 |
| 2019/0187843 A1* | 6/2019 | Ye ............................ G06F 3/047 |

* cited by examiner

*Primary Examiner* — Nelson M Rosario
(74) *Attorney, Agent, or Firm* — Brooks Kushman P.C.

(57) ABSTRACT

Provided are a flexible touch substrate, a method for manufacturing the same, and a display device. A flexible touch substrate has a bending region and a non-bending region, and including a flexible base and a plurality of touch electrodes arranged on the flexible base, in which a transparent conductive layer is arranged at least on the plurality of touch electrodes corresponding in a one-to-one manner to the touch electrodes in the bending region, an orthogonal projection of each transparent conductive pattern on the flexible base at least partially covers a corresponding touch electrodes, and each of the transparent conductive patterns is electrically connected to the corresponding touch electrode and electrically insulated from the other touch electrodes than the corresponding touch electrode.

19 Claims, 6 Drawing Sheets

FLEXIBLE TOUCH SUBSTRATE, METHOD FOR MANUFACTURING THE SAME, AND DISPLAY DEVICE

CROSS-REFERENCE TO RELATED APPLICATION

This application claims priority to Chinese Patent Application No. 201810796790.7 filed on Jul. 19, 2018, which is incorporated herein by reference in its entirety.

TECHNICAL FIELD

The present disclosure relates to the field of touch display technology, in particular to a flexible touch substrate, a method for manufacturing the same, and a display device.

BACKGROUND

In recent years, since electronic devices have changed into various shapes, the shape of a touch screen applied to an electronic device has also been changed to correspond to the shape of the electronic device, for example, a touch screen that can be curved bent, and curled. The existing flexible touch technology has been able to realize the requirements of folding and bending a touch screen. The flexible touch screen generally uses a metal grid with good ductility as touch electrodes, which can prevent the metal layer from being damaged during the bending process and has an effect of dispersing stress. However, when the times of bending are too many, it is difficult to avoid damaging the metal grid. Once the metal grid is damaged, the flexible touch screen loses its effect. Therefore, it is necessary to consider improving the reliability of the flexible touch screen, to ensure the service life of the flexible touch screen in a way of good functions.

SUMMARY

In one aspect, the present disclosure provides a flexible touch substrate having a bending region and a non-bending region and including a flexible base and a plurality of touch electrodes arranged on the flexible base, in which a transparent conductive layer is arranged at least on the touch electrodes in the bending region, the transparent conductive layer includes a plurality of transparent conductive patterns corresponding in a one-to-one manner to the touch electrodes in the bending region, an orthogonal projection of each transparent conductive pattern on the flexible base at least partially covers a corresponding touch electrode of the plurality of touch electrodes, and each of the transparent conductive patterns is electrically connected to the corresponding touch electrode and electrically insulated from the other touch electrodes than the corresponding touch electrode.

Optionally, the transparent conductive layer is in direct contact with the touch electrodes in the bending region; or the transparent conductive layer is bonded to the touch electrodes in the bending region via a transparent conductive adhesive.

Optionally, the plurality of touch electrodes are all located in the same layer, and an orthogonal projection of each transparent conductive pattern on the flexible base does not go beyond a region of the corresponding touch electrode.

Optionally, the touch electrodes includes a plurality of first touch electrodes in a first touch electrode layer and a plurality of second touch electrodes in a second touch electrode layer, the second touch electrode layer is located on a side of the first touch electrode layer away from the flexible base.

Optionally, the transparent conductive layer includes a plurality of transparent conductive patterns corresponding in a one-to-one manner to respective second touch electrodes, each of the transparent conductive patterns is electrically connected to the corresponding second touch electrode, and an orthogonal projection of each transparent conductive pattern on the flexible base does not go beyond a region of the corresponding second touch electrode.

Optionally, the plurality of second touch electrodes extends in a direction perpendicular to a length direction of the bending region.

Optionally, a plurality of touch electrode bridges is provided to connect adjacent touch electrodes, the transparent conductive layer further includes a plurality of transparent conductive pattern bridges corresponding in a one-to-one manner to the plurality of touch electrode bridges, and wherein each of the transparent conductive pattern bridges is electrically connected to the corresponding touch electrode bridge, and an orthogonal projection of each transparent conductive patter bridge on the flexible base does not cover the other touch electrodes than the adjacent touch electrodes connected by the corresponding touch electrode bridge.

Optionally, the plurality of touch electrodes is composed of a metal grid.

Optionally, the transparent conductive layer is made of at least one material selected from the group consisting of graphene, a metal nanowire, a carbon nanotube, and an organic conductive material.

In another aspect, the present disclosure further provides a method for manufacturing a flexible touch substrate having a bending region and a non-bending region and including a flexible base and a plurality of touch electrodes arranged on the flexible base, the method including steps of:

forming a transparent conductive layer at least on the plurality of touch electrodes in the bending region, in which the transparent conductive layer includes a plurality of transparent conductive patterns corresponding in a one-to-one manner to the touch electrodes in the bending region, an orthogonal projection of each transparent conductive pattern on the flexible base at least partially covers a corresponding touch electrode of the plurality of touch electrodes, and each of the transparent conductive patterns is electrically connected to the corresponding touch electrode and electrically insulated from the other touch electrodes than the corresponding touch electrode.

Optionally, the step of forming the transparent conductive layer at least on the plurality of touch electrodes in the bending region includes:

providing a support;
forming the transparent conductive layer on the support;
providing a transparent conductive adhesive on the transparent conductive layer; and
bonding the transparent conductive layer to the touch electrodes via the transparent conductive adhesive and removing the support.

In another aspect, the present disclosure also provides a display device including the flexible touch substrate as described above.

DETAILED DESCRIPTION

In order to make the technical problems to be solved, the technical solutions, and the advantages of the examples of the present disclosure more clear, the present disclosure will be described hereinafter in conjunction with the drawings and specific examples.

Figure 1:
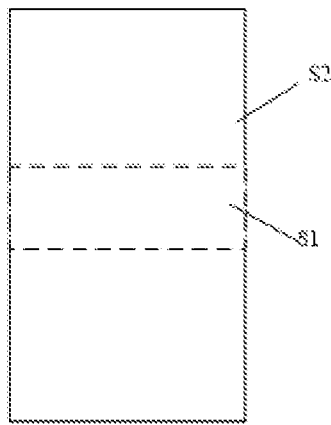
FIG. 1 is a schematic view of a flexible touch substrate.
Figure 2:
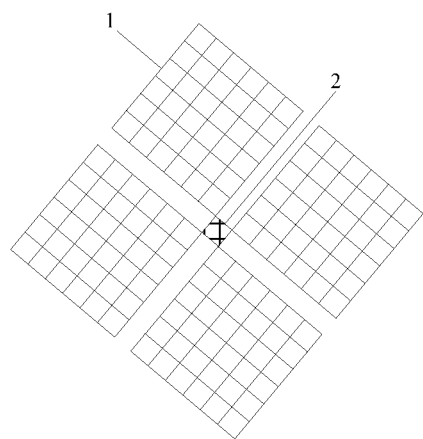
FIG. 2 is a schematic view of a touch electrode using a metal grid.

The related flexible touch technology has been able to realize the requirements of folding and bending a touch screen. As shown in FIG. 1, the related flexible touch substrate includes a bending region S1 and a non-bending region S2. As shown in FIG. 2, the flexible touch substrate generally uses a metal grid with good ductility as the touch electrodes 1, and reference sign 2 is a touch electrode bridge. The use of the metal grid to form the touch electrodes 1 can prevent the metal layer from being damaged during the bending process and has an effect of dispersing stress. However, when the times of bending are too many, it is still difficult to avoid damaging the metal grid. Once the metal grid is damaged, the flexible touch substrate loses its effect. Therefore, it is necessary to consider improving the reliability of the flexible touch substrate, to ensure the service life of the flexible touch substrate in a way of good functions.

Embodiments of the present disclosure provide a flexible touch substrate with high reliability and excellent service life, a method for manufacturing the same, and a display device including the flexible touch substrate.

According to an embodiment of the present disclosure, provided is a flexible touch substrate having a bending region and a non-bending region and including a flexible base and a plurality of touch electrodes arranged on the flexible base, in which a transparent conductive layer is arranged at least on the plurality of touch electrodes in bending region, the transparent conductive layer includes a plurality of transparent conductive patterns corresponding in a one-to-one manner to the touch electrodes in the bending region, an orthogonal projection of each transparent conductive pattern on the flexible base at least partially covers the corresponding touch electrode of the plurality of touch electrodes, and each of the transparent conductive patterns is electrically connected to the corresponding touch electrode and electrically insulated from the other touch electrodes than the corresponding touch electrode.

Figure 3:
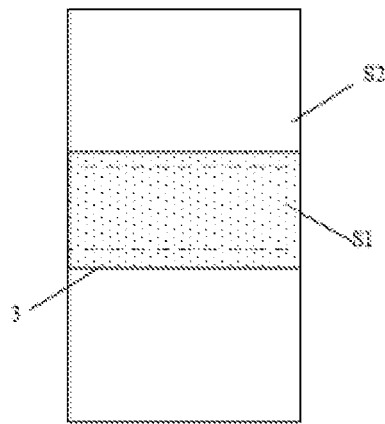
FIG. 3 is a schematic diagram of a flexible touch substrate according to an embodiment of the present disclosure.

As shown in FIG. 3, the flexible touch substrate includes a bending region S1 and a non-bending region S2, and a transparent conductive layer 3 is arranged at least on the plurality of touch electrodes in the bending region S1. In the embodiment of the present disclosure, the transparent conductive layer 3 includes a plurality of transparent conductive patterns corresponding in a one-to-one manner to the touch electrodes in the bending region, each of the transparent conductive patterns is electrically connected to the corresponding touch electrode. In such an arrangement, even if the touch electrodes in the bending region of the flexible touch substrate is damaged, the touch electrodes in the bending region can still work normally, because the transparent conductive patterns are also arranged on the touch electrodes. Therefore, the arrangement can improve the reliability, service life and the bending resistance of the flexible touch substrate. In addition, when the flexible touch substrate is applied in the display device, the transparent conductive layer does not need to be formed in a grid shape to avoid the illuminated pixel region, and thus the manufacturing process is not complicated.

Optionally, the transparent conductive patterns are arranged on all the touch electrodes in the bending region S1, thereby improving the reliability of all the touch electrodes in the bending region. Further, the transparent conductive patterns can also be arranged on all touch electrodes in the whole touch regions, thereby improving the reliability of all touch electrodes in the whole touch regions. It should be noted that, in the above solution, it is necessary to ensure that the adjacent touch electrodes of the bending region S1 are not electrically connected via the transparent conductive layer 3.

When the manufacturing process of the transparent conductive layer 3 can be performed in a low temperature (for example, lower than 85° C.) environment, a transparent conductive layer can be directly formed on the touch electrodes. The manufacturing process of the transparent conductive layer does not cause damage to the flexible touch substrate. That is, the transparent conductive layer 3 is in direct contact with the touch electrodes in the bending region S1. When the manufacturing process of the transparent conductive layer 3 needs to be performed in an environment of high temperature (for example, higher than 85° C.), in order to avoid the manufacturing process of the transparent conductive layer 3 from damaging to the flexible touch substrate, the transparent conductive layer 3 may be prepared first, and then the transparent conductive layer 3 is bonded to the touch electrodes via a transparent conductive adhesive. That is, the transparent conductive layer 3 is bonded to the touch electrodes of the bending region via the transparent conductive adhesive.

Optionally, the transparent conductive layer 3 may be made of at least one material selected from the group consisting of graphene, a metal nanowire, a carbon nanotube, and an organic conductive material such as poly(3,4-ethylenedioxythiophene monomer) (PEDOT). Optionally, the flexible touch substrate is made of graphene material. Graphene is a hexagonal single-layer structure formed of carbon atoms and has two-dimensional ballistic transport characteristics. The two-dimensional ballistic transport of charges in the graphene material means a transport in a state where there is almost no resistance caused by scattering. Therefore, the mobility of charges in graphene is very high. Further, one layer of graphene has a transmittance of 97.9%, thereby having high transparency. Moreover, the elastic resilience of graphene is 15% or more.

The graphene layer can be formed by a method, such as thermal chemical vapor deposition (CVD), plasma enhanced CVD (PE-CVD), and/or molecular beam epitaxy (MBE). In the case of using thermal CVD method, the graphene layer can be formed by injecting a hydrocarbon in a liquid form, such as a vapor of $CH_4$, $C_2H_4$ or $C_2H_2$ or benzene ($C_6H_6$), into a deposition chamber at a high temperature of about 700° C. or higher. In the case of using PE-CVD method, the graphene layer can be formed by using the same reaction gas as that used in the thermal CVD method but at a temperature lower than the temperature of thermal CVD method. In this case, a source, such as direct current (DC) power, radio frequency (RF) power, and microwave power, can be used to form plasma. In the case of using MBE method, the graphene layer can be formed by maintain the substrate temperature at a temperature of about 600° C. to about 1000° C. under ultra high vacuum (UHV) conditions and forming carbon flux in a deposition chamber using an electron beam (E-beam) or the like.

It can be seen that the temperature for preparing the graphene layer is relatively high. Therefore, the graphene layer cannot be directly prepared on the touch electrodes, otherwise the stability of the flexible touch substrate will be adversely affected. A transparent conductive layer may be formed on the support by using a graphene layer, and then the transparent conductive layer may be bonded to the touch electrodes in the bending region by using a transparent conductive adhesive. This can improve the reliability, service life and the bending resistance of the flexible touch substrate. Moreover, by using the transparent conductive adhesive for attaching, the alignment process has a large tolerance, and can ensure the yield of the touch product.

Figure 4:
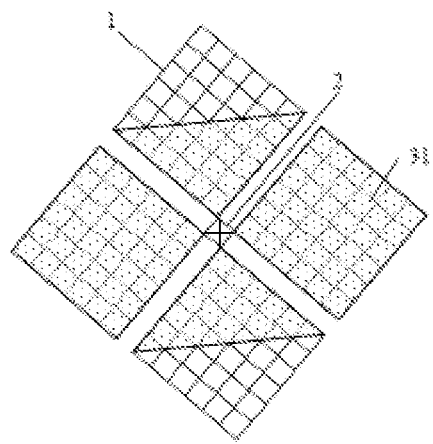
FIGS. 4-8 are schematic views of a touch electrode covered with a transparent conductive layer according to an embodiment of the present disclosure.
Figure 5:
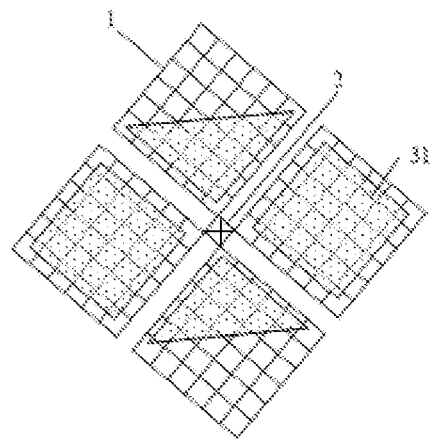

In an optional embodiment, as shown in FIGS. 4-5, the plurality of touch electrodes 1 are all located in the same layer, the plurality of touch electrode bridges 2 are arranged at the intersection of the touch electrodes 1, and an orthogonal projection of each of the transparent conductive patterns 31 on the flexible base do not go beyond a setting region of the corresponding touch electrode 1. When the touch electrodes 1 use a grid formed of a metal trace, the setting region of each touch electrode 1 is a region defined by the outermost metal trace of the touch electrode 1. Therefore, the transparent conductive patterns 31 do not conduct the adjacent touch electrodes 1, and thus the performance of the flexible touch substrate can be ensured. In addition, if an orthogonal projection of each transparent conductive pattern 31 on the flexible base does not go beyond setting regions of the corresponding touch electrode, the transparent conductive layer is relatively easy to attach when attached to the plurality of touch electrodes, and alignment accuracy has a large tolerance.

Figure 6:
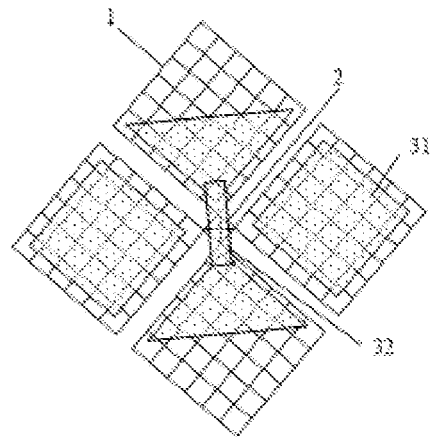
Figure 7:
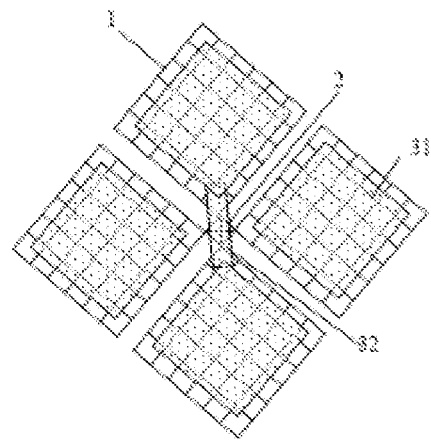

Optionally, as shown in FIGS. 6-7, a plurality of touch electrode bridges 2 is provided to connect adjacent touch electrodes, and the transparent conductive layer 3 further includes a plurality of transparent conductive pattern bridges 32 corresponding in a one-to-one manner to the plurality of touch electrode bridges 2. Each of the transparent conductive bridge 32 is electrically connected to the corresponding touch electrode bridge 2 connecting adjacent touch electrodes in a one-to-one manner, and an orthogonal projection of each transparent conductive bridge 32 on the flexible base does not cover a setting region of the corresponding touch electrode bridge 2. When the touch electrode bridges 2 use a grid formed of a metal trace, the setting region of each touch electrode bridge 2 is a region defined by the outermost metal trace of the touch electrode bridge 2. In this setting, even if the touch electrode bridges 2 are damaged, the touch electrode bridges 2 can still work normally, because the transparent conductive bridges 32 are arranged on the touch electrode bridges 2. Therefore, the reliability and the service life of the flexible touch substrate can be improved.

Figure 8:
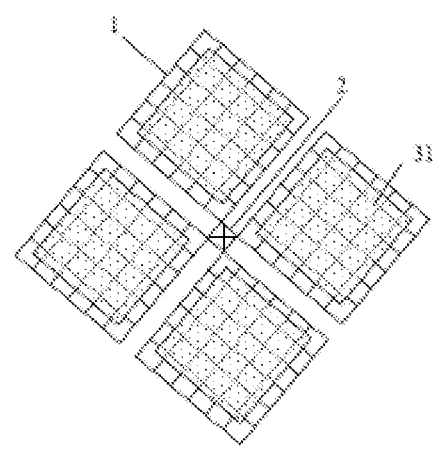

Optionally, as shown in FIG. 8, the transparent conductive bridges 32 may not be arranged on the touch electrode bridges 2.

Figure 9:
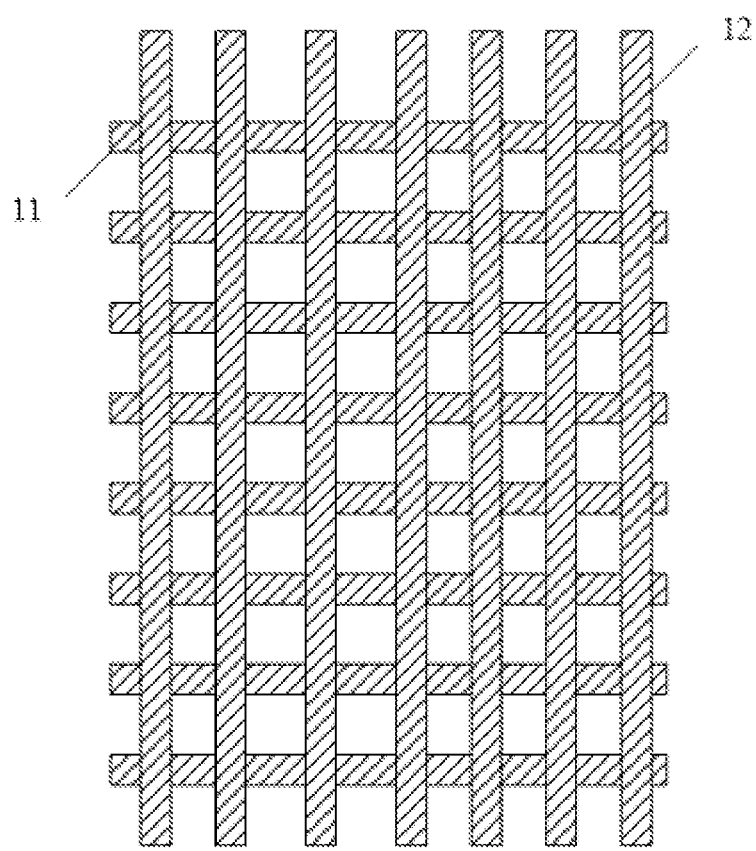
FIG. 9 is a schematic diagram of a double-layer touch electrode according to an embodiment of the present disclosure.
Figure 10:
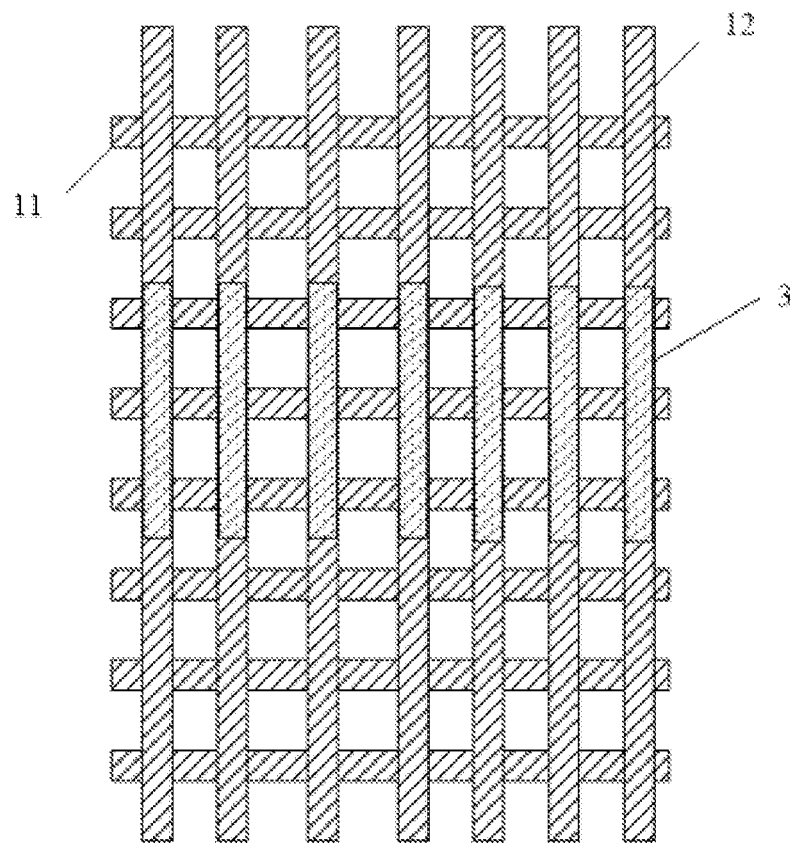
FIG. 10 is a schematic diagram of a double-layer touch electrode covered with a transparent conductive layer according to an embodiment of the present disclosure.

In another embodiment, as shown in FIGS. 9-10, the plurality of touch electrodes include a plurality of first touch electrodes 11 in the first touch electrode layer and a plurality of second touch electrodes 12 in the second touch electrode layer, the second touch electrode layer is located on a side of the first touch electrode layer away from the flexible base. The transparent conductive layer 3 includes a plurality of second transparent conductive patterns corresponding in a one-to-one manner to respective second touch electrodes, each of the transparent conductive patterns is electrically connected to the corresponding second touch electrodes 12, and an orthogonal projection of each transparent conductive patterns on the flexible base does not go beyond a setting region of the corresponding second touch electrode 12. When the second touch electrodes 12 use a grid formed of a metal trace, the setting region of each second touch electrode 12 is a region defined by the outermost metal trace of the second touch electrode 12. When the plurality of touch electrodes include two layers of touch electrodes, the outer touch electrodes are relatively easy to be damaged when bent, and the inner touch electrodes are not easy to be damaged. Therefore, the plurality of transparent conductive patterns can be arranged only on the outer touch electrodes. In this arrangement, when the outer touch electrodes are damaged, the outer touch electrodes can still work normally, because the plurality of transparent conductive patterns are also arranged on the plurality of touch electrodes, thereby improving the reliability and the service life of the flexible touch substrate.

Optionally, the extending direction of the second touch electrodes 12 is perpendicular to the length direction of the bending region S1 or the extending direction of the folding line. When the bending region is bent, the touch electrodes perpendicular to the length direction of the bending region (or the extending direction of the folding line) is relatively easy to be damaged, and thus the touch electrodes perpendicular to the longitudinal direction of the bending region can be arranged on the upper layer of the flexible touch substrate.

Optionally, the touch electrodes are composed of a metal grid, and thus the bending resistance of the plurality of touch electrodes can be improved. Of course, the touch electrodes are not limited to a metal grid, and may be made of a transparent conductive material, such as ITO. When the touch electrodes are made of a transparent conductive material such as ITO, the touch electrodes may be in a block shape.

The flexible touch substrate of the present embodiment can be applied to an on-cell touch display device, and can also be applied to an external touch display device.

According to an embodiment of the present disclosure, further provided is a method for manufacturing a flexible touch substrate having a bending region S1 and a non-bending region S2, as shown in FIG. 3, and including a flexible base and a plurality of touch electrodes arranged on the flexible base, the method including:

forming a transparent conductive layer 3 at least on the plurality of touch electrodes in the bending region, in which the transparent conductive layer 3 includes a plurality of transparent conductive patterns corresponding in a one-to-one manner to the touch electrodes in the bending region, an orthogonal projection of each transparent conductive pattern on the flexible base at least partially covers the corresponding touch electrodes of the plurality of touch electrodes, and each of the transparent conductive patterns is electrically connected to the corresponding touch electrode and electrically insulated from the other touch electrodes than the corresponding touch electrode.

In this embodiment, each of the transparent conductive patterns is electrically connected to the corresponding touch electrode. Even if the touch electrodes of the flexible touch substrate are damaged, the touch electrodes in the bending region of the flexible touch substrate can still work normally, because the transparent conductive patterns are also arranged on the touch electrodes, thereby improving the reliability, the service life and the bending resistance of the flexible touch substrate. In addition, when the flexible touch substrate is applied in the display device, the transparent conductive layer does not need to be formed in a grid shape to avoid the illuminated pixel region, and thus the manufacturing process is not complicated.

Optionally, the transparent conductive patterns are arranged on all touch electrodes in the bending region S1. This setting improves the reliability of all touch electrodes in the bending region. Optionally, the first transparent conductive patterns can also be arranged on all touch electrodes in the whole touch regions of the bending region and the non-bending region. This setting can improve the reliability of all touch electrodes in all the touch regions of the bending region and the non-bending region. It should be noted that, in the above solution, it is necessary to ensure that the adjacent touch electrodes of the bending region S1 are not electrically connected via the transparent conductive layer 3.

When the manufacturing process of the transparent conductive layer 3 can be performed in a low temperature (for example, lower than 85° C.) environment, a transparent conductive layer can be directly formed on the touch electrodes. The manufacturing process of the transparent conductive layer does not cause damage to the flexible touch substrate. That is, the transparent conductive layer 3 is in direct contact with the touch electrodes in the bending region S1. When the manufacturing process of the transparent conductive layer 3 needs to be performed in an environment of high temperature (for example, higher than 85° C.), in order to avoid the manufacturing process of the transparent conductive layer 3 from damaging to the flexible touch substrate, the transparent conductive layer 3 may be prepared first, and then the transparent conductive layer 3 is bonded to the touch electrodes via a transparent conductive adhesive. That is, the transparent conductive layer 3 is bonded to the touch electrodes of the bending region via the transparent conductive adhesive.

Figure 11:
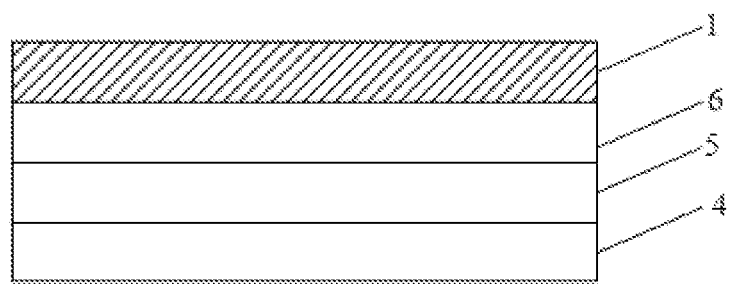
FIG. 11 is a schematic cross-sectional view of a flexible touch substrate not covered with a transparent conductive layer according to an embodiment of the present disclosure.

As shown in FIG. 11, the flexible touch substrate not formed with a transparent conductive layer 3 includes a driving circuit layer 5, a thin film encapsulation layer 6, and touch electrodes 1 on the flexible base 4.

When the manufacturing process of the transparent conductive layer 3 can be performed in a low temperature (for example, lower than 85° C.) environment, a transparent conductive layer 3 can be directly formed on the touch electrodes. The manufacturing process of the transparent conductive layer 3 does not cause damage to the flexible touch substrate. That is, the transparent conductive layer 3 is in direct contact with the plurality of touch electrodes 1 of the bending region S1.

When the manufacturing process of the transparent conductive layer 3 needs to be performed in an environment of high temperature (for example, higher than 85° C.), in order to avoid the manufacturing process of the transparent conductive layer 3 from damaging to the flexible touch substrate, the transparent conductive layer 3 may be prepared first, and then the transparent conductive layer 3 is bonded to the touch electrodes via a transparent conductive adhesive. That is, the transparent conductive layer 3 is bonded to the touch electrodes in the bending region via the transparent conductive adhesive.

Figure 12:
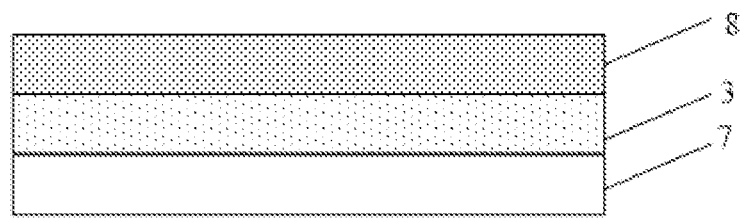
FIG. 12 is a schematic view showing a structure in which a transparent conductive layer and a transparent conductive adhesive are formed on a support according to an embodiment of the present disclosure.
Figure 13:
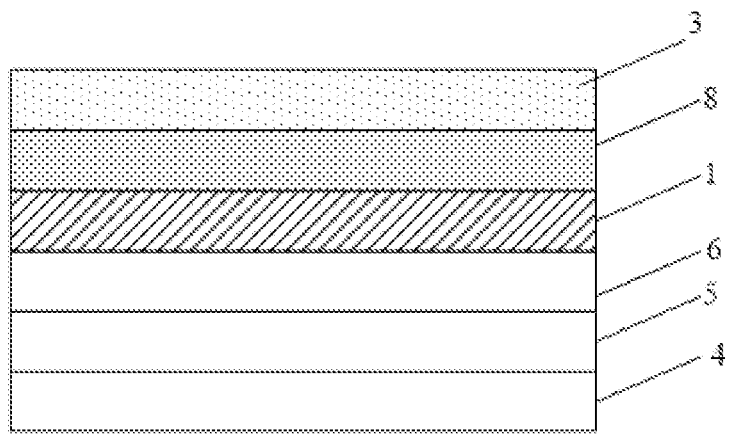
FIG. 13 is a schematic cross-sectional view of a flexible touch substrate formed with a transparent conductive layer according to an embodiment of the present disclosure.

As shown in FIG. 12, in the preparation of the transparent conductive layer 3, a support 7 is provided, in which the support 7 may be a flexible base such as a polyimide substrate or a rigid base; a transparent conductive layer 3 is formed on the support 7 and patterned to form a plurality of transparent conductive patterns; and a transparent conductive adhesive 8 is formed on the transparent conductive layer 3. Thereafter, as shown in FIG. 13, the transparent conductive layer 3 is bonded to the plurality of touch electrodes 1 via the transparent conductive adhesive 8, and then the support 7 is removed, thereby obtaining the flexible touch substrate of the present embodiment.

The transparent conductive layer 3 may be made of at least one material selected from the group consisting of graphene, a metal nanowire, a carbon nanotube, and an organic conductive material, such as PEDOT. Graphene is a hexagonal single-layer structure formed of carbon atoms and has two-dimensional ballistic transport characteristics. The two-dimensional ballistic transport of charges in the graphene material means a transport in a state where there is almost no resistance caused by scattering. Therefore, the mobility of charges in graphene is very high. Further, one layer of graphene has a transmittance of 97.9%, thereby having high transparency. Moreover, the elastic resilience of graphene is 15% or more. Therefore, graphene can be applied to the flexible touch substrate.

The graphene layer can be formed by a method, such as thermal chemical vapor deposition (CVD), plasma enhanced CVD (PE-CVD), and/or molecular beam epitaxy (MBE). In the case of using thermal CVD method, the graphene layer can be formed by injecting a hydrocarbon in a liquid form, such as a vapor of $CH_4$, $C_2H_4$ or $C_2H_2$ or benzene ($C_6H_6$), into a deposition chamber at a high temperature of about 700° C. or higher. In the case of using PE-CVD method, the graphene layer can be formed by using the same reaction gas as that used in the thermal CVD method but at a temperature lower than the temperature of thermal CVD method. In this case, a source, such as direct current (DC) power, radio frequency (RF) power, and microwave power, can be used to form plasma. In the case of using MBE method, the graphene layer can be formed by maintain the substrate temperature at a temperature of about 600° C. to about 1000° C. under ultra high vacuum (UHV) conditions and forming carbon flux in a deposition chamber using an electron beam (E-beam) or the like.

It can be seen that the temperature for preparing the graphene layer is relatively high. Therefore, the graphene layer cannot be directly prepared on the touch electrodes, otherwise the stability of the flexible touch substrate will be adversely affected. A transparent conductive layer may be formed on the support by using a graphene layer, and then the transparent conductive layer may be bonded to the touch electrodes in the bending region by using a transparent conductive adhesive. This can improve the reliability, service life and the bending resistance of the flexible touch substrate. In addition, by using the transparent conductive adhesive for attaching, the alignment process has a large tolerance, and can ensure the yield of the touch product.

According to an embodiment of the present disclosure, further provided is a display device, including the flexible touch substrate as described above or a display panel containing the flexible touch substrate. The display device may include any product or component having a display function, such as a television, a display, a digital photo frame, a mobile phone, and a tablet computer. Optionally, the display device further includes a flexible circuit board, a printed circuit board, and a backplane.

Optionally, the touch electrodes of the flexible touch substrate can be composed of a metal grid. When the touch electrodes is composed of a metal grid, the display panel includes a plurality of light emitting regions and a non-light emitting region connected to the light emitting region, in which each grid of the plurality of touch electrodes of the flexible touch substrate corresponds to at least one light emitting region in one-to-one manner, and an orthogonal projection of the at least one light emitting region on the flexible touch substrate falls within the corresponding grid. In this arrangement, the grid of touch electrodes will not affect the display of the display panel.

In the display device of the present embodiment, a transparent conductive layer is arranged at least on the touch electrodes, and the conductive layer includes a plurality of transparent conductive patterns corresponding in a one-to-one manner to the touch electrodes in the bending region, each of the transparent conductive patterns is electrically connected to the corresponding touch electrode. In this embodiment, even if the touch electrodes in the flexible touch substrate are damaged, the touch electrodes in the bending region of the flexible touch substrate can still work normally, because the plurality of transparent conductive patterns are also arranged on the touch electrodes, thereby improving the reliability, the service life and the bending resistance of the flexible touch substrate. In addition, when the flexible touch substrate is applied in the display device, the transparent conductive layer does not need to be formed in a grid shape to avoid the illuminated pixel region, and thus the manufacturing process is not complicated.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly. It will be understood that when an element, such as a layer, film, region, or substrate, is referred to as being "on" or "under" another element, the element may be directly "on" or "under" another element, or there may be an intermediate element.

The above descriptions are embodiments listed in the present disclosure. It should be noted that one skilled in the art would make several improvements and substitutions without departing from the principles of the present disclosure. These improvements and modifications should also be regarded as the protection scope of the present disclosure.

What is claimed is:

1. A flexible touch substrate having a bending region and a non-bending region and comprising a flexible base and a plurality of touch electrodes arranged on the flexible base,
wherein a transparent conductive layer is arranged at least on the touch electrodes in the bending region, the transparent conductive layer comprises a plurality of transparent conductive patterns corresponding in a one-to-one manner to the touch electrodes in the bending region, an orthogonal projection of each transparent conductive pattern on the flexible base at least partially covers a corresponding touch electrode of the plurality of touch electrodes, and each of the transparent conductive patterns is electrically connected to the corresponding touch electrode and electrically insulated from the other touch electrodes than the corresponding touch electrode,
wherein a plurality of touch electrode bridges is provided to connect adjacent touch electrodes, and the transparent conductive layer further comprises a plurality of transparent conductive pattern bridges corresponding in a one-to-one manner to the plurality of touch electrode bridges; and wherein each of the transparent conductive pattern bridges is electrically connected to the corresponding touch electrode bridge, and an orthogonal projection of each transparent conductive pattern bridge on the flexible base does not cover the other touch electrodes than the adjacent touch electrodes connected by the corresponding touch electrode bridge.

2. The flexible touch substrate of claim 1, wherein the transparent conductive layer is in direct contact with the touch electrodes in the bending region; or the transparent conductive layer is bonded to the touch electrodes in the bending region via a transparent conductive adhesive.

3. The flexible touch substrate of claim 1, wherein the plurality of touch electrodes are all located in a same layer, and the orthogonal projection of each transparent conductive pattern on the flexible base does not go beyond a region of the corresponding touch electrode.

4. The flexible touch substrate of claim 1, wherein the touch electrodes comprise a plurality of first touch electrodes in a first touch electrode layer and a plurality of second touch electrodes in a second touch electrode layer, and the second touch electrode layer is located on a side of the first touch electrode layer away from the flexible base.

5. The flexible touch substrate of claim 4, wherein the transparent conductive layer comprises a plurality of transparent conductive patterns corresponding in a one-to-one manner to respective second touch electrodes, each of the transparent conductive patterns is electrically connected to the corresponding second touch electrode, and the orthogonal projection of each transparent conductive pattern on the flexible base does not go beyond a region of the corresponding second touch electrode.

6. The flexible touch substrate of claim 4, wherein the plurality of second touch electrodes extends in a direction perpendicular to a length direction of the bending region.

7. The flexible touch substrate of claim 1, wherein the plurality of touch electrodes is composed of a metal grid.

8. The flexible touch substrate of claim 1, wherein the transparent conductive layer is made of at least one material selected from the group consisting of graphene, a metal nanowire, a carbon nanotube, and an organic conductive material.

9. A display device, comprising the flexible touch substrate of claim 1.

10. The display device of claim 9, wherein the transparent conductive layer is in direct contact with the touch electrodes in the bending region; or the transparent conductive layer is bonded to the touch electrodes in the bending region via a transparent conductive adhesive.

11. The display device of claim 9, wherein the plurality of touch electrodes are all located in a same layer, and the orthogonal projection of each the transparent conductive pattern on the flexible base does not go beyond a region of the corresponding touch electrodes.

12. The display device of claim 9, wherein the touch electrodes comprise a plurality of first touch electrodes in a first touch electrode layer and a plurality of second touch electrodes in a second touch electrode layer, and the second touch electrode layer is located on a side of the first touch electrode layer away from the flexible base.

13. The display device of claim 12, wherein the transparent conductive layer comprises a plurality of second transparent conductive patterns corresponding in a one-to-one manner to respective second touch electrodes, each of the transparent conductive patterns is electrically connected to the corresponding second touch electrodes, and the orthogonal projection of each transparent conductive pattern on the flexible base does not go beyond a region of the corresponding second touch electrode.

14. The display device of claim 9, wherein the plurality of second touch electrodes extends in a direction perpendicular to a length direction of the bending region.

15. The display device of claim 9, wherein the plurality of touch electrodes is composed of a metal grid.

16. The display device of claim 9, wherein the transparent conductive layer is made of at least one material selected from the group consisting of graphene, a metal nanowire, a carbon nanotube, and an organic conductive material.

17. A method for manufacturing a flexible touch substrate having a bending region and a non-bending region and comprising a flexible base and a plurality of touch electrodes arranged on the flexible base, the method comprising steps of:
forming a transparent conductive layer at least on the plurality of touch electrodes in the bending region, wherein the transparent conductive layer comprises a plurality of transparent conductive patterns corresponding in a one-to-one manner to the touch electrodes in the bending region, an orthogonal projection of each transparent conductive pattern on the flexible base at least partially covers a corresponding touch electrode of the plurality of touch electrodes, and each of the transparent conductive patterns is electrically connected to the corresponding touch electrode and electrically insulated from the other touch electrodes than the corresponding touch electrode,
wherein a plurality of touch electrode bridges is provided to connect adjacent touch electrodes, and the transparent conductive layer further comprises a plurality of transparent conductive pattern bridges corresponding in a one-to-one manner to the plurality of touch electrode bridges; and wherein each of the transparent conductive pattern bridges is electrically connected to the corresponding touch electrode bridge, and the orthogonal projection of each transparent conductive pattern bridge on the flexible base does not cover the other touch electrodes than the adjacent touch electrodes connected by the corresponding touch electrode bridge.

18. The method of claim 17, wherein the step of forming the transparent conductive layer at least on the plurality of touch electrodes in the bending region comprises:
providing a support;
forming the transparent conductive layer on the support;
providing a transparent conductive adhesive on the transparent conductive layer; and
bonding the transparent conductive layer to the touch electrodes via the transparent conductive adhesive and removing the support.

19. A method for manufacturing a flexible touch substrate having a bending region and a non-bending region and comprising a flexible base and a plurality of touch electrodes arranged on the flexible base, the method comprising steps of:
forming a transparent conductive layer at least on the plurality of touch electrodes in the bending region, wherein the transparent conductive layer comprises a plurality of transparent conductive patterns corresponding in a one-to-one manner to the touch electrodes in the bending region, an orthogonal projection of each transparent conductive pattern on the flexible base at least partially covers a corresponding touch electrode of the plurality of touch electrodes, and each of the transparent conductive patterns is electrically connected to the corresponding touch electrode and electrically insulated from the other touch electrodes than the corresponding touch electrode,
wherein the step of forming the transparent conductive layer at least on the plurality of touch electrodes in the bending region comprises:
providing a support;
forming the transparent conductive layer on the support;
providing a transparent conductive adhesive on the transparent conductive layer; and
bonding the transparent conductive layer to the touch electrodes via the transparent conductive adhesive and removing the support.

* * * * *